United States Patent [19]

Satoh et al.

[11] Patent Number: 5,219,794
[45] Date of Patent: Jun. 15, 1993

[54] SEMICONDUCTOR INTEGRATED CIRCUIT DEVICE AND METHOD OF FABRICATING SAME

[75] Inventors: Toshihiko Satoh, Sayama; Tetsuya Hayashida, Nishitama; Hiroshi Kikuchi, Ohme; Takeo Yamada, Tokyo; Takashi Mori, Yamato, all of Japan

[73] Assignees: Hitachi, Ltd., Tokyo; Hitachi Hokkai Semiconductor, Ltd., Hokkaido, both of Japan

[21] Appl. No.: 850,738

[22] Filed: Mar. 13, 1992

[30] Foreign Application Priority Data

Mar. 14, 1991 [JP] Japan .................................. 3-49808
Jan. 29, 1992 [JP] Japan .................................. 4-13742

[51] Int. Cl.⁵ .................................. H01L 21/60
[52] U.S. Cl. .................................. 437/209; 437/206; 437/215; 437/221
[58] Field of Search ............... 437/209, 221, 207, 217, 437/220, 215, 206

[56] References Cited

U.S. PATENT DOCUMENTS

| | | | |
|---|---|---|---|
| 4,742,024 | 5/1988 | Sugimoto et al. | 437/209 |
| 4,764,804 | 8/1988 | Sahara et al. | 437/221 |
| 4,814,295 | 3/1989 | Mehta | 437/209 |
| 4,831,212 | 5/1989 | Ogata et al. | 437/221 |

FOREIGN PATENT DOCUMENTS

62-249429  10/1987  Japan .
63-310139  12/1988  Japan .

*Primary Examiner*—Brian E. Hearn
*Assistant Examiner*—Kevin M. Picardat
*Attorney, Agent, or Firm*—Pennie & Edmonds

[57] ABSTRACT

In a chip carrier wherein a semiconductor chip is face down bonded to a package substrate through solder bumps, then covered with a cap and sealed hermetically using a sealing solder, the back of the semiconductor chip being bonded closely to the underside of the cap using a solder for heat transfer, a solder preform serving as the said heat transfer solder is heat-melted and a portion of the thus melted solder is allowed to flow into the sealing portion to effect the hermetic seal of the chip. Furthermore, in order to improve the flowability of the solder preform during the melt flow thereof, a metallized layer for heat transfer formed under the heat transfer solder of the cap and a sealing metallized layer are partially connected with each other through a connecting metallized layer.

16 Claims, 8 Drawing Sheets

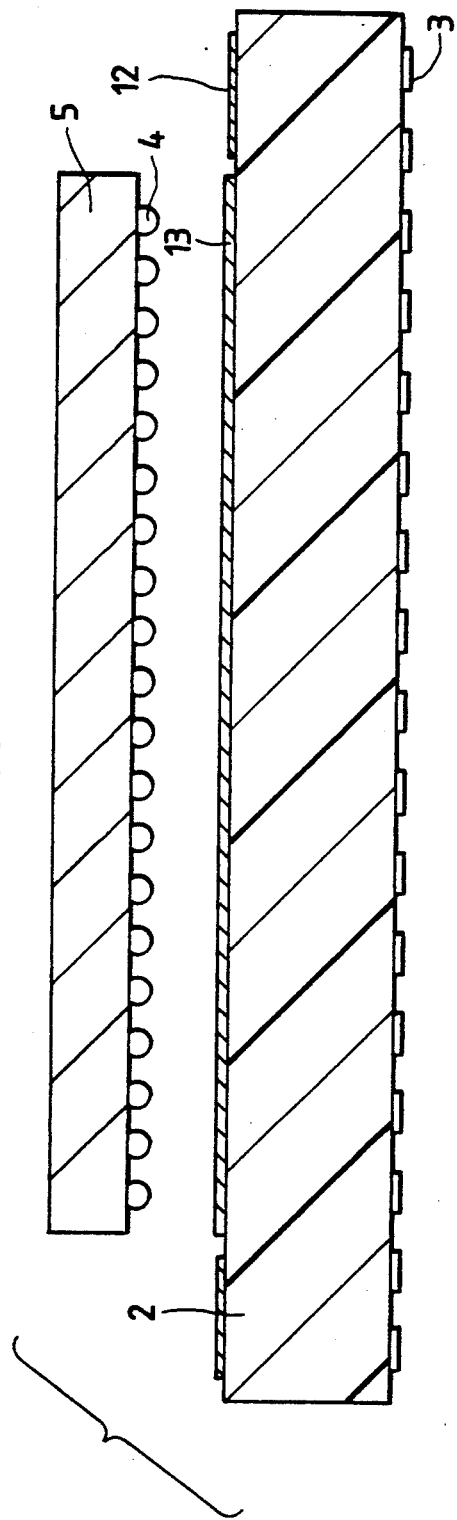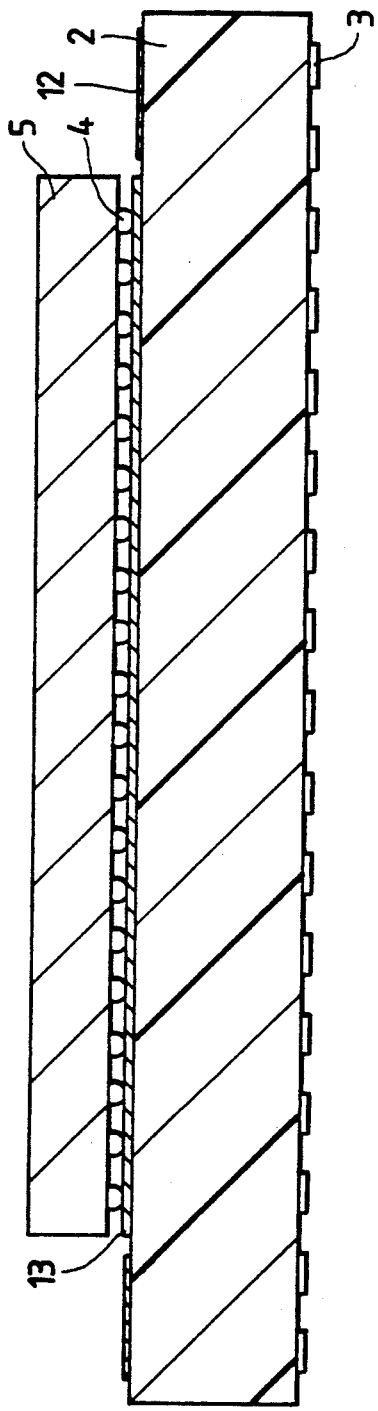

SEMICONDUCTOR INTEGRATED CIRCUIT DEVICE AND METHOD OF FABRICATING SAME

BACKGROUND OF THE INVENTION

The present invention relates to a semiconductor integrated circuit device, and more particularly to a technique which is applicable effectively to a chip carrier type semiconductor integrated circuit device.

In Japanese Patent Laid Open Nos. 249429/87 and 310139/88 there is described a chip carrier in which a semiconductor chip mounted on a package substrate is hermetically sealed with a cap.

In the chip carrier described in the above literatures, a package substrate formed of a ceramic material and a semiconductor chip are hermetically sealed with a cap which is formed in the turned square U-shape in section to provide a package structure, the semiconductor chip being face down bonded to electrodes through solder bumps so that a main surface thereof with elements formed thereon is opposed to the package substrate, said electrodes being formed on a thin wiring layer provided on a main surface of the package substrate, the thin wiring layer comprising a conductor layer of aluminum (Al) or copper (Cu) for example and an insulating layer of a polyimide for example. The back of the chip thus sealed in the cavity enclosed with the package substrate and the cap is bonded to the underside of the cap through a packed layer solder. Metallized layers are formed on the back of the semiconductor chip and also on both the underside and leg portion of the sealing cap.

In the interior of the package substrate there is formed an internal wiring, which provides an electrical connection between the electrodes formed on the thin wiring layer on the main surface side of the package substrate and electrodes formed on the underside of the package substrate. On the underside electrodes are formed solder bumps which serve as external terminals at the time of mounting the chip carrier to a module substrate for example.

The above chip carrier is assembled in the following manner, as described in Japanese Patent Laid Open No. 249429/87. First, positioning of a semiconductor chip is performed and the chip is face down bonded to a package substrate through solder bumps. Next, a soldering material, e.g. solder, is interposed between the back of the semiconductor chip and the underside of a cap and also placed in the portion to be sealed, that is, between the package substrate and leg portion of the cap. In this state, the cap is put on the package substrate and the whole is heated to a temperature not lower than the melting temperature of the soldering material to solder the members located on both sides of the soldering material and thereby seal the marginal portion of the semiconductor chip.

SUMMARY OF THE INVENTION

In the above chip carrier assembling method, however, since a solder is placed beforehand on the back of the chip and also in the sealing portion of the cap followed by reflow, there are formed voids due to the presence of an oxide film formed on the surface of the sealing solder. More particularly, at the time of bonding of the oxide film-formed surface of the solder, part of the oxide film is broken and connection is made, but at the oxide film portion which has not been broken there remains the oxide film even after reflow, thus causing voids. Also when flux is used in the bonding to prevent oxidation, the flux will remain and so voids are formed.

In the heating for sealing, the temperature is raised up to the melting temperature of the sealing solder or higher, so the sealing solder melts and the cap and the package substrate are bonded together. In this state, the internal temperature of the cavity further increases, so that when the chip carrier is cooled, the solder may retreat or blow-holes may be formed, thus causing a defect of the seal, or leakage.

Further, if the amount of solder is too large, there will arise the problem of protrusion of the solder, while if it is too small, holes will be formed in the sealed portion, thus causing leakage These problems result in deterioration of the production yield.

It is an object of the present invention to provide a technique capable of improving the production yield of a chip carrier having the foregoing construction.

It is another object of the present invention to provide a technique capable of shortening the time required for fabricating a chip carrier having the foregoing construction.

It is a further object of the present invention to provide a chip carrier type semiconductor device having a superior sealing property.

The above and other objects and novel features of the present invention will become apparent from the following description and the accompanying drawings.

According to the present invention, in order to achieve the above-mentioned objects, in a chip carrier in which a chip is mounted on a main surface of a package substrate in an opposed relation of a main surface thereof to the substrate through solder bumps, a cap is soldered to the main surface of the package substrate using a sealing solder to seal the chip hermetically, and the back of the chip is soldered to the cap using a heat transfer solder on the underside of the cap, not only the cap is mounted on the main surface of the package substrate with the semiconductor chip mounted thereon, but also a solder preform is heat-melted in the gap between the cap and the chip, thereby allowing part of the solder preform to flow to the connection between the package substrate and the cap to effect a hermetic seal for the semiconductor chip.

Furthermore, in a chip carrier in which a cap is soldered, using a sealing solder, to a main surface of a package substrate with a chip mounted thereon through solder bumps, to seal the chip hermetically, and the back of the chip is soldered to the cap using a heat transfer solder on the underside of the cap, there are provided, for improving the wettability of solder, a metallized layer (first metallized layer) on the marginal portion of the main surface of the package substrate and also on the lower surface of a leg portion of the cap, a metallized layer (second metallized layer) for the heat transfer solder on the underside of the cap, and a metallized layer (third metallized layer) for the sealing solder on the inner wall surface of the cap. Further provided is an outer wall metallized layer for the sealing solder for the absorption of surplus solder. The metallized layer of the cap for the heat transfer solder and the metallized layer for the sealing solder formed on the leg portion of the cap are partially connected with each other through a metallized layer formed sideways of the cap.

According to the above means, at the time of sealing with the cap, the solder on the back of the chip melts and flows to the portion to be sealed, so that the chip and the cap are partially brought into contact with each other to determine the thickness of the heat transfer solder layer. In this case, surplus solder flows into the portion to be sealed, or the sealing portion, of the cap through the metallized layers provided in the same portion and provides a seal after flowing round the same portion. Thus, since part of the sealing solder is kept continuous to the exterior until the end of the sealing, the sealing can be effected without the formation of blow-holes caused by increase in the internal pressure of the cavity. Besides, since the solder flowing into the portion to be sealed has flowed out while breaking an oxide film formed on the surface thereof, it does not contain the oxide when flowing into said portion. Therefore, in the portion to be sealed it is possible to prevent the formation of voids in the solder.

Moreover, since surplus solder can be absorbed by the metallized layer formed on the outer wall surface of the sealing portion of the cap, it is possible to set the amount of solder to be used while taking variations in the processing of each member into account.

Furthermore, since the metallized layer for the heat transfer solder of the cap and the metallized layer for the sealing solder formed on the leg portion of the cap are partially connected with each other through the metallized layer provided sideways of the cap, when the solder sandwiched in between the chip and the cap is heat-meted, the molten solder can flow quickly into the sealing portion.

BRIEF DESCRIPTION OF THE DRAWINGS

FIGS. 3 to 6 are sectional views showing how to fabricate the chip carrier type semiconductor integrated circuit device;

DESCRIPTION OF THE PREFERRED EMBODIMENTS

Figure 1:
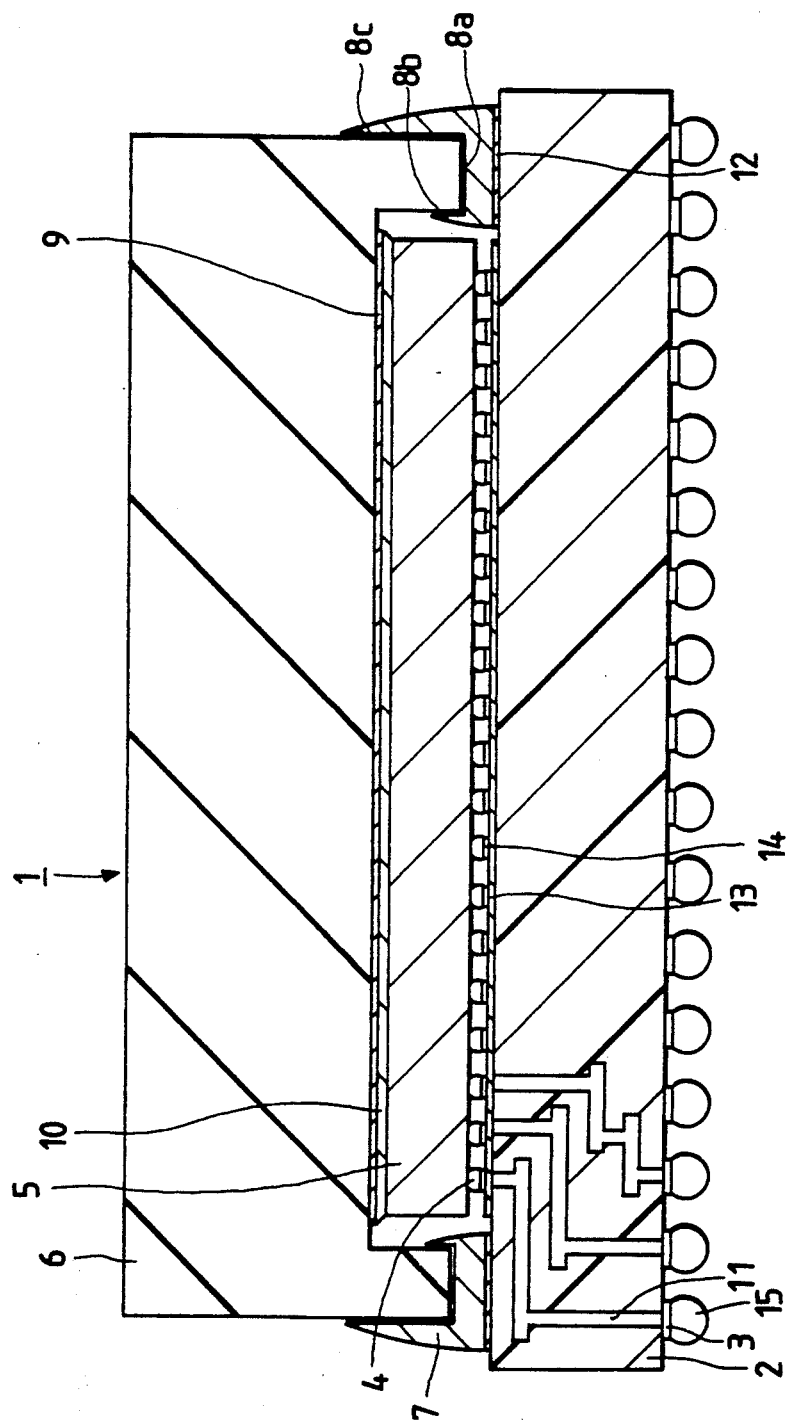
FIG. 1 is a sectional view of a chip carrier type semiconductor integrated circuit device according to an embodiment of the present invention.

The present invention will be described hereinunder in terms of embodiments thereof. In all of the drawings for explanation of the embodiments, the portions having the same functions are indicated by the same reference numerals and repeated explanations thereof will be omitted.

EMBODIMENT 1

FIG. 1 illustrates a chip carrier 1 according to embodiment 1 of the present invention. The chip carrier 1 has a package structure wherein a thin wiring layer 13 comprising a conductor layer of aluminum (Al) or copper (Cu) for example and an insulating layer of a polyimide for example is formed on a main surface of a package substrate 2 of a ceramic material such as mullite, and a semiconductor chip 5 is face down bonded through solder bumps 4 onto electrodes 14 formed on the thin wiring layer 13 and is hermetically sealed with a cap 6. The chip carrier 1 is very small, 10 to 20 mm long by 10 to 20 mm wide as its external dimensions, and it is also called a micro carrier for LSI chip.

The solder bumps 4 are formed of a Pb/Sn alloy (melting temperature: about 320°–327° C.) containing about 1-3 wt% of Sn for example. The cap 6 is formed of a ceramic material of high thermal conductivity, e.g. aluminum nitride (AlN) and its leg portion is soldered to the marginal portion of the main surface of the package substrate 2 using a sealing solder 7.

In order to improve the wettability of the sealing solder 7, a sealing metallized layer 12 is formed on the marginal portion of the main surface of the package substrate 2 and a sealing metallized layer 8a is formed on the underside of the leg portion of the cap 6. The sealing metallized layer 12 on the package substrate side is constituted by a composite metal film deposited according to a plating method or a sputtering method using, for example, W, Ni and Au, and the sealing metallized layer 8a on the cap 6 side is constituted by a composite metal film deposited according to a plating method or a sputtering method using, for example, Ti, Ni and Au.

The back of the chip 5 sealed in the cavity enclosed with the main surface of the package substrate 2 and the underside of the cap 6 is soldered to the underside of the cap 6 using a heat transfer solder 10. This is for transferring the heat generated from the chip 5 to the cap 6 through a heat transfer solder 10. For improving the wettability of the heat transfer solder 10, a metallized layer 9 for the heat transfer solder is provided on the underside area of the cap 6 opposed to the back of the chip 5. The sealing solder 7 and the heat transfer solder 10 are each constituted by a Pb/Sn alloy (melting temperature: 275°–300° C.) containing about 10 wt % of Sn for example.

On the underside of the package substrate 2 there are formed solder bumps 15 which serve as external terminals at the time of mounting the chip carrier onto a module substrate for example. In the interior of the substrate 2 there is formed an internal wiring 11 using W for example, whereby the electrodes 14 on the thin wiring layer 13 and electrodes 3 are connected together electrically. The solder bumps 15 are formed by a solder which is lower in melting point than the sealing solder 7, e.g. Sn/Ag alloy (melting temperature: about 221°–222° C.) containing about 3.0 wt % of Ag.

Figure 2:
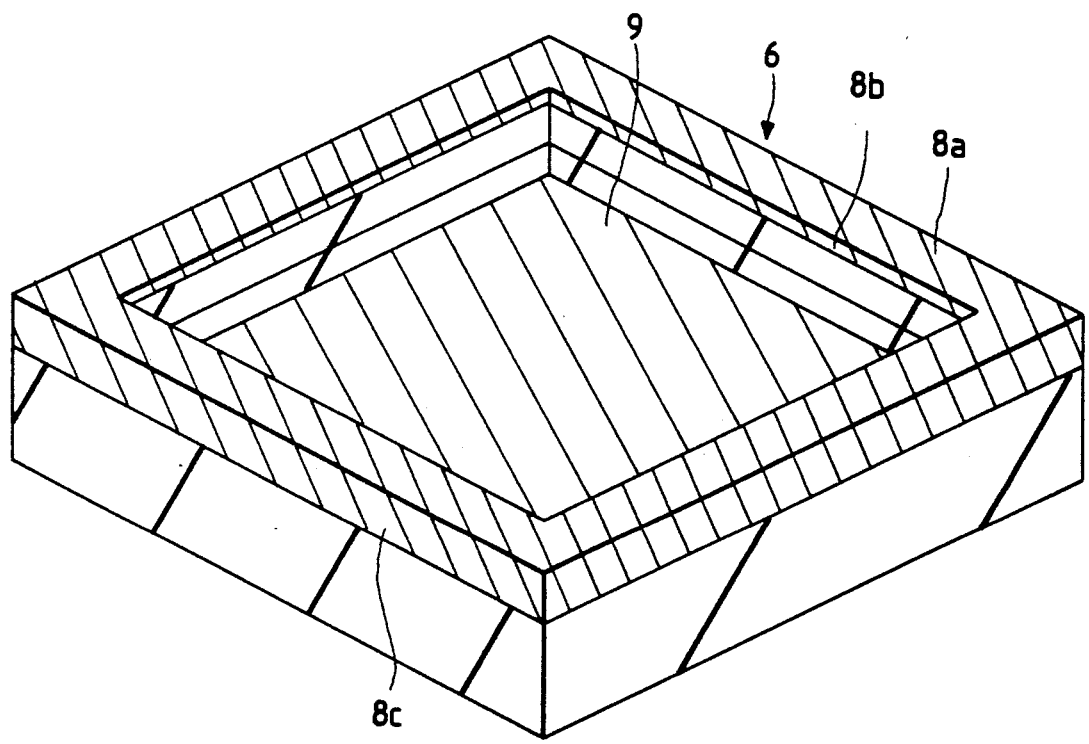
FIG. 2 is a perspective view showing a cap of the chip carrier type semiconductor integrated circuit devices.

FIG. 2 is a perspective view showing the inside of the cap 6. The metallized layer formed on the leg portion (positioned on the top in the figure) of the cap 6 comprises a lower portion 8a, an inner wall portion 8b and an outer wall portion 8c. The metallized layer 9 for heat transfer is provided on the underside area of the cap 6 opposed to the back of the chip 5. For example, these metallized layers are constituted by the same composite alloy film which has been formed through the same process.

Now, how to assemble the chip carrier 1 of the above construction will be described below with reference to FIGS. 3 to 6.

First, as shown in FIG. 3, the solder bumps formed on the main surface of the semiconductor chip 5 are positioned accurately onto the electrodes 14 of the package substrate 2, using a machine such as, for example, a chip mounting apparatus. Next, the package substrate 2 is conveyed to a reflow oven. The interior of the reflow oven is held in an atmosphere of an inert gas, e.g. nitrogen or argon, to prevent the oxidation of the surfaces of the solder bumps 4. The internal temperature of the oven is set a little higher (about 340°–350° C.) than the melting temperature of the solder bumps 4 to heat and melt the solder bumps, whereby the chip 5 is face down bonded to the main surface of the package substrate 2 (FIG. 4).

Figure 5:
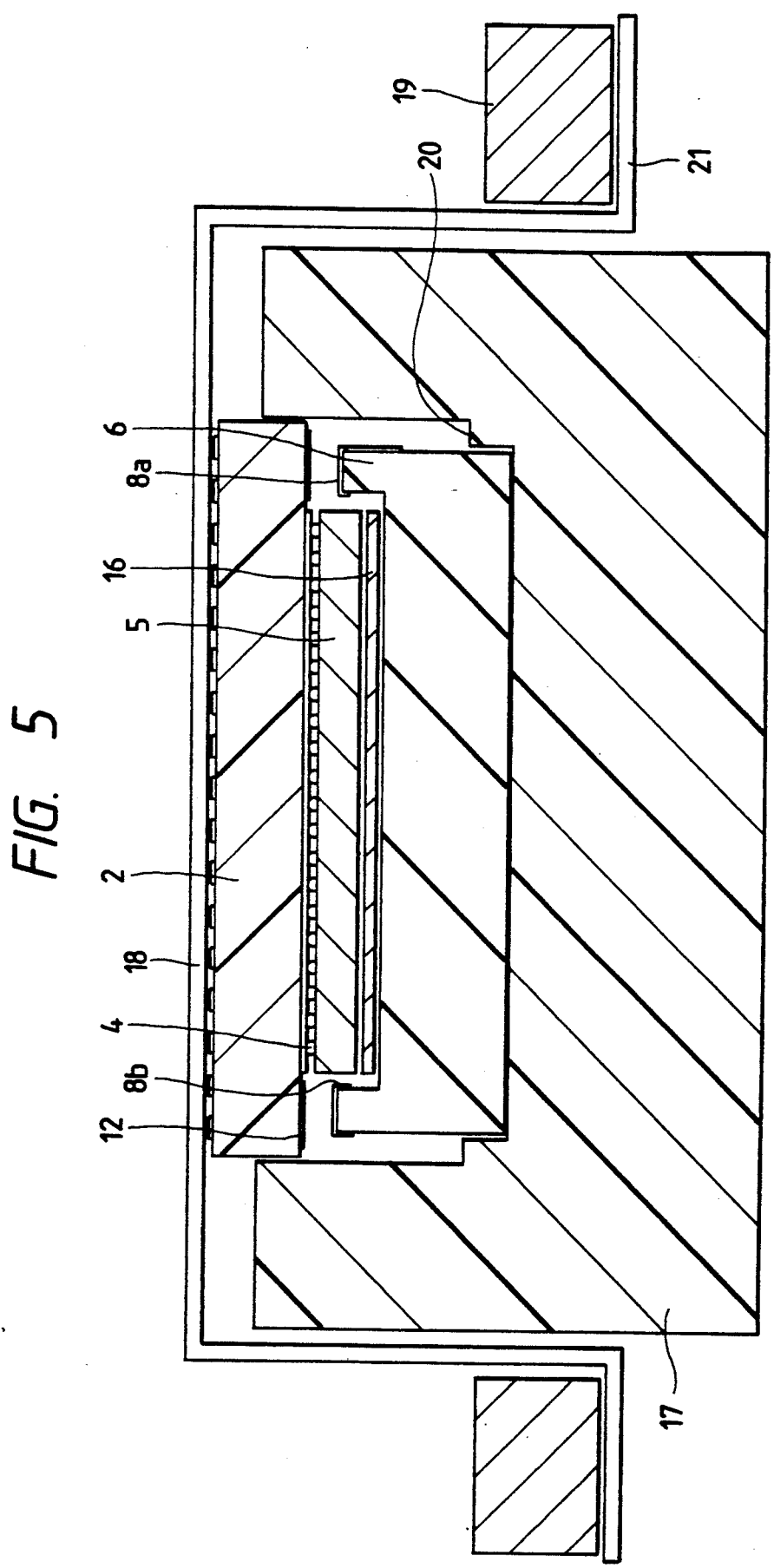
Figure 6:
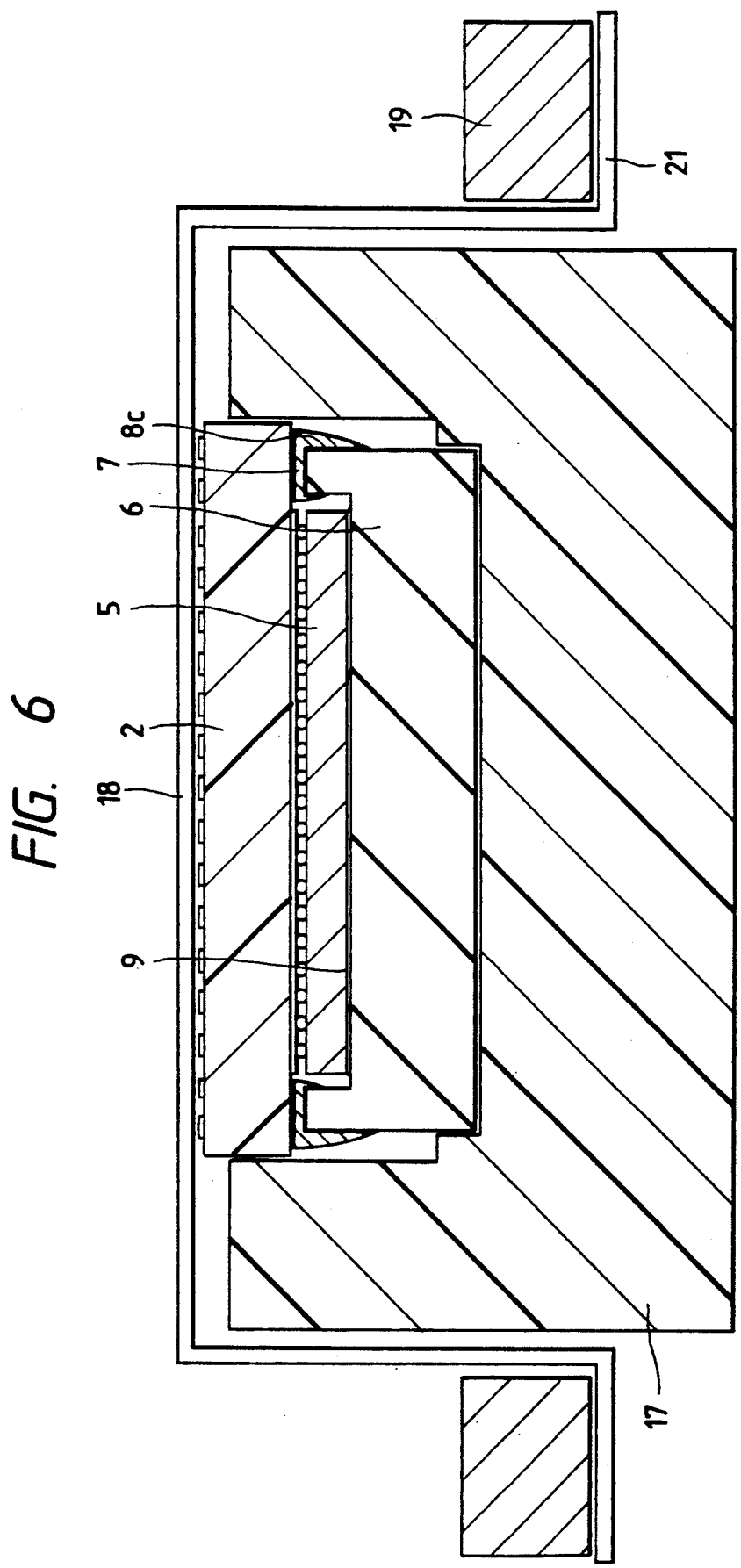

Next, sealing is performed with the cap 6, as shown in FIG. 5. First, the cap 6 is placed in a lower jig 17 formed of a material which has been adjusted in thermal expansion coefficient to the chip carrier, e.g. aluminum nitride (AlN), in such a manner that the metallized layers 8a and 9 face up. Then, a solder preform 16 of a volume which permits both heat transfer and sealing, that is, a volume which is almost the same as the total volume of the heat transfer solder and the sealing solder, is placed in the cavity of the cap 6. Furthermore, the package substrate 2 with the semiconductor chip 5 mounted thereon as shown in FIG. 4 is placed on the solder preform 16 so that the chip side faces down. A projection 20 formed in the interior of the lower jig 17 is for positioning the cap 6 and the package substrate 2 relative to each other during the heat treatment for sealing. The package substrate 2 carrying the semiconductor chip 5 thereon is mounted in such a manner that the metallized layer 8b on the inner wall surface of the cap is positioned lower than the main surface of the chip with the bumps 4 formed thereon, as shown in FIGS. 5 and 6. Then, an upper jig 18 is put on the underside (the electrodes 3 formed side) of the package substrate 2 and a weight 19 having a ring-like planar shape is put on weight rest portion 21 of the upper jig 18. In this state the assembly is conveyed t a reflow oven. The interior of the reflow oven is held in an atmosphere of an inert gas, e.g. nitrogen, or a reducing gas, e.g. nitrogen+hydrogen, to prevent re-oxidation of the surface of the solder preform 16 and oxidation of the surface of a molten presolder 25.

Next, the internal temperature of the oven is set at a temperature a little higher (310° C. or so) than the temperature at which the solder bumps 4 do not melt but the solder preform 16 can be melted, and heating is made at this temperature to melt the solder preform 16. Since the load of the weight 19 is imposed on the package substrate in a melted state of the solder preform 16, the semiconductor chip 5 goes down until it contacts the cap 6 through a small amount of the heat transfer solder 10, whereby the amount of solder for heat transfer and the cavity volume are determined.

Then other solder portion of the solder preform 16 than the portion which has been used for the transfer of heat stays between the cap sealing portion and the chip, but comes into contact with the metallized layer 8b on the inner wall surface of the sealing portion, then flows along the metallized layer 8b quickly into the gap formed between the metallized layer 8a in the sealing portion of the cap and the metallized layer 12 in the sealing portion of the package substrate. Under the surface tension of the molten solder, the solder flows round the portion to be sealed and becomes the sealing solder 7. Now, the sealing of the chip carrier 1 is almost completed, as shown in FIG. 6. In this case, the sealing is effected in an approximately equal state in pressure between the interior and exterior of the cavity. Surplus solder is absorbed by the metallized layer 8c formed on the outer wall portion of the cap 6. The solder flowing temperature and the solder solidifying temperature are about the same. Preferably, the difference of the two is in the range of 10° to 20° C.

After the substantial completion of the sealing, the chip carrier 1 is cooled. In the case where the solder used for sealing is a Pb/Sn alloy solder (melting temperature: 275° to 300° C.) containing about 10 wt % of Sn for example and Au is used partially in the metallized layers, thus providing a ternary Pb/Sn/Au alloy (minimum liquid layer temperature: 176° C.) at the time of melting of the solder, there is performed a quench sealing for solidifying at a cooling rate of not less than 1.5° C./sec at least in the range from about 300° C. or higher to about 176° C. or lower.

After the completion of the sealing, solder bumps 15 for mounting of the chip carrier onto a module substrate are formed on the electrodes 3 provided on the underside of the package substrate 2, as shown in FIG. 1.

Figure 7:
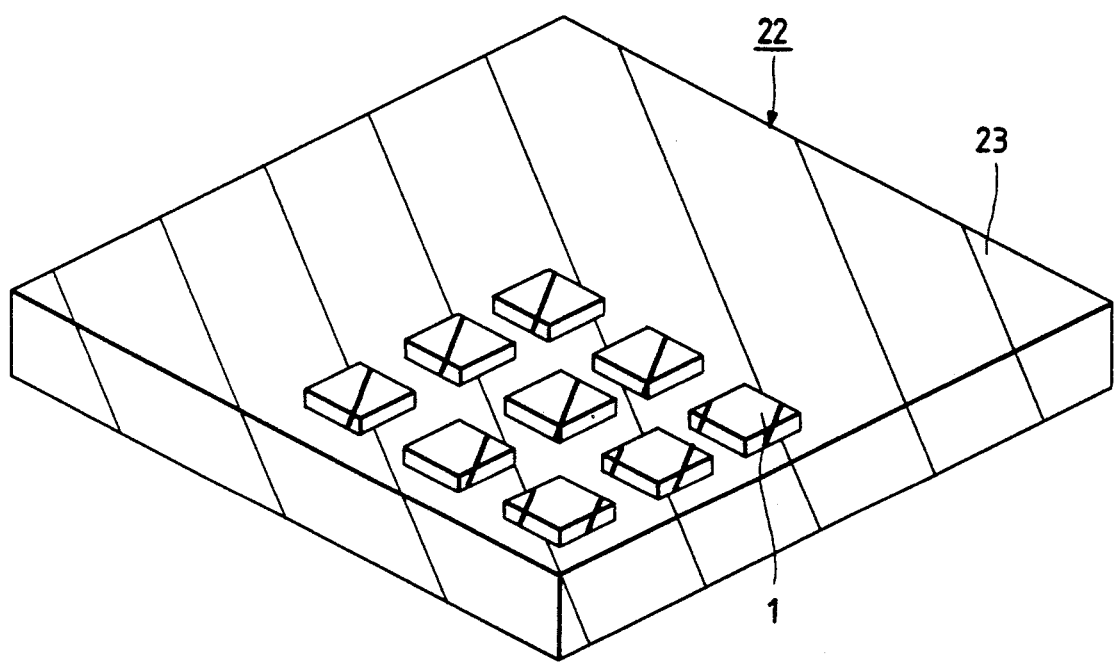
FIG. 7 is a perspective view of a semiconductor module with the chip carrier type semiconductor devices of the invention mounted thereon.

Furthermore, as shown in FIG. 7, a plurality of chip carriers 1 are mounted on a module substrate 23 to constitute a semiconductor module 22.

EMBODIMENT 2

Figure 8:
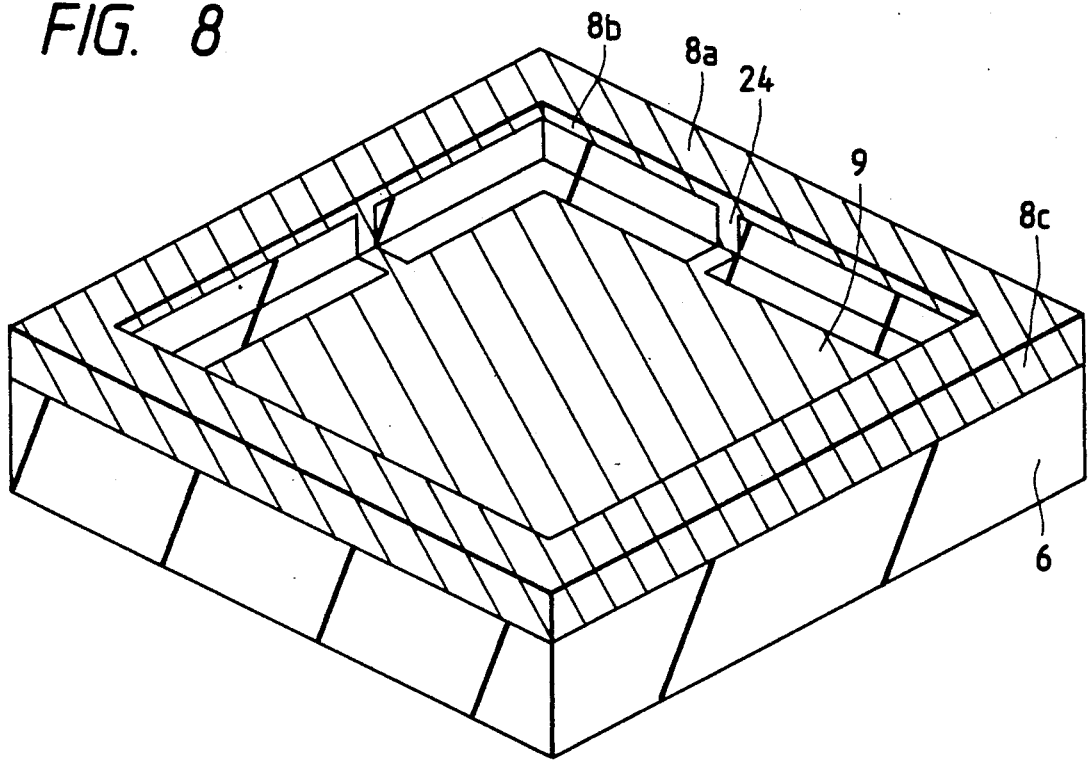
FIG. 8 is a perspective view showing a cap of a chip carrier type semiconductor integrated circuit device according to another embodiment of the present invention.
Figure 9:
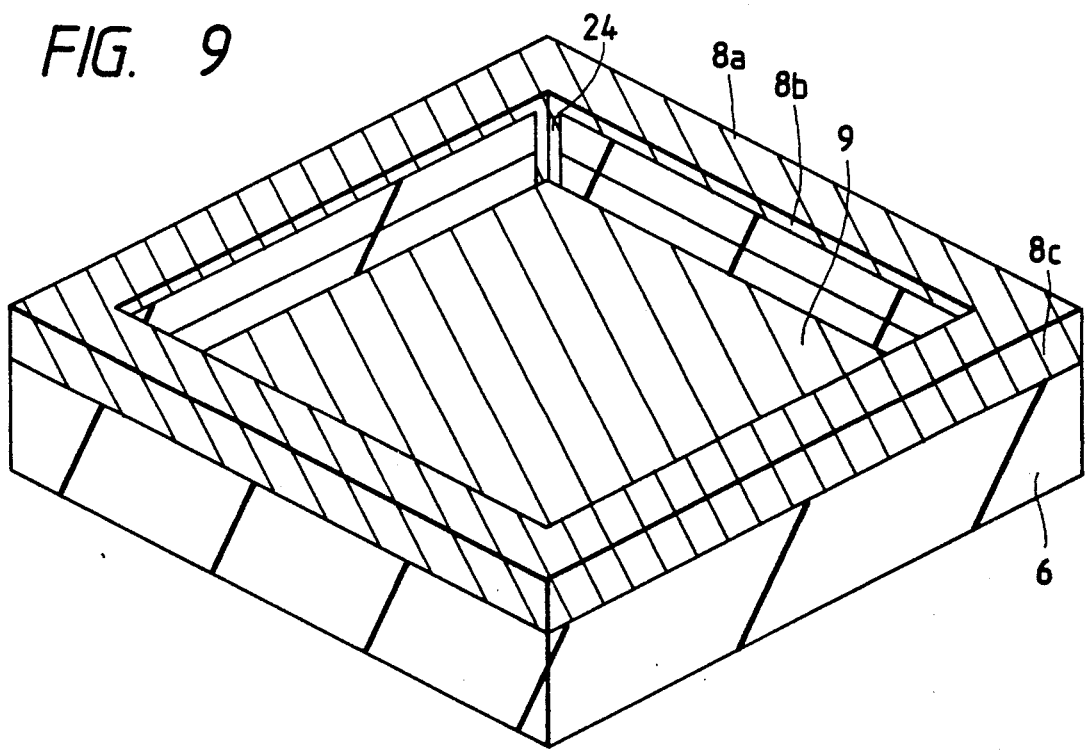
FIG. 9 is a perspective view showing a cap of a chip carrier type semiconductor integrated circuit device according to a further embodiment of the present invention.

FIGS. 8 and 9 are perspective views of caps further embodying the present invention.

As shown in FIG. 8, sealing metallized layers 8a, 8b and 8c are formed on the underside (positioned at the top in the figure) of a leg portion of a cap 6, and a metallized layer 9 for heat transfer solder is formed on the underside area of the cap 6 opposed to the back of the semiconductor chip 5. The metallized layers 8a, 8b, 8c and the metallized layer 9 are partially connected with each other through connecting metallized layers 24 formed on the inner side walls of the cap 6. For example, the metallized layers 8a, 8b, 8c, 9 and 24 are constituted by the same composite metal film which has been formed through the same process.

In FIG. 9, which is a modification of FIG. 8, the metallized layers 24 are provided at the four inner corners of the cap 6.

By connecting the metallized layer for heat transfer solder and the metallized layers for sealing partially with each other in the manner described above, the flowability of molten solder at the time of sealing is improved and hence the production yield becomes higher. In both cases, if the area of the connecting metallized layers is too large, an excess amount of solder will flow into the gap between the marginal portion of the main surface of the package substrate and the leg portion of the cap and the amount of the heat transfer solder remaining on the back of the chip becomes insufficient, resulting in that voids are generated in the gap between the back of the chip and the underside of the cap and the heat radiation property of the chip is thereby deteriorated. Therefore, it is necessary to set an optimum area of the connecting metallized layer according to the area and shape of the cap.

EMBODIMENT 3

Figure 10:
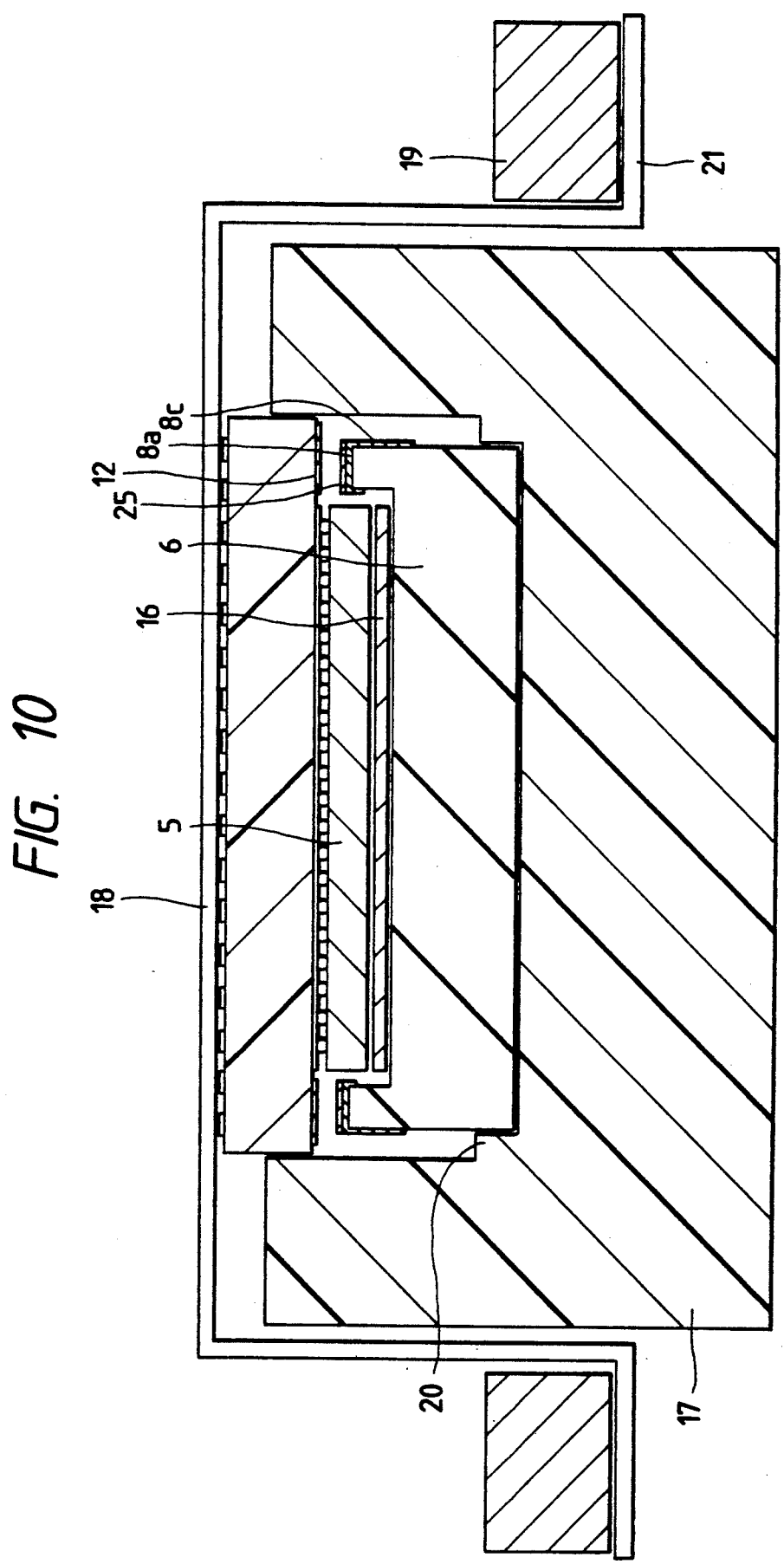
FIG. 10 is a sectional view showing another method for fabricating the chip carrier type semiconductor device.

Referring to FIG. 10, there is illustrated another method for fabricating a chip carrier type semiconductor device according to the present invention.

According to embodiment 3, at the time of production of the chip carrier 1 in embodiment 1, a presolder layer 25 is formed on the leg portion of the cap 6 by plating for example. This is for preventing the shortage of solder when the amount of solder in the sealing portion is small. It is necessary to set the thickness of the presolder layer 25 so that the internal and external pressures of the cavity can be adjusted while the solder is melted at the time of sealing. More specifically, the thickness of the presolder layer is set in such a manner that a gap is formed between the package substrate 2 and the presolder layer 25, that is, both does not contact each other, when the cap 6 is placed on the lower jig 17, the solder preform 16 is put thereon and the package substrate 2 with the chip 5 thereon is mounted.

Although the present invention has been described above concretely in terms of embodiments thereof, it goes without so saying that the invention is not limited to those embodiments and that various modifications may be made within the scope not departing from the gist of the invention.

The following is a brief description of effects attained by typical embodiments of the present invention disclosed herein.

In a chip carrier wherein a cap is soldered to a main surface of a package substrate with a chip mounted thereon through solder bumps, using a sealing solder, to seal the chip hermetically and the back of the chip soldered to the underside of the cap using a heat transfer solder, a first metallized layer (a sealing metallized layer) for improving the wettability of the sealing solder is formed on the marginal portion of the main surface of the package substrate and also on the lower surface and inner and outer wall surfaces of the leg portion of the cap, and a second metallized layer (a metallized layer for the heat transfer solder) for improving the wettability of the heat transfer solder is formed on the underside area of the cap opposed to the back of the chip. By supplying solder to the sealing portion through the heat transfer portion without direct solder supply to the sealing portion, using said cap, followed by quench sealing, it is possible to improve the production yield of the chip carrier and also possible to shorten the chip carrier manufacturing time. Furthermore, by providing a third metallized layer (a connecting metallized layer) for connecting the first metallized layer formed on the lower surface and inner and outer wall surfaces of the leg portion of the cap and the second metallized layer partially with each other, it is possible to further improve the production yield of the chip carrier.

What is claimed is:

1. A method of fabricating a semiconductor device, comprising the steps of:
   providing a semiconductor chip having a main surface and a back, with a plurality of salient electrodes being formed on said main surface, and also providing a substrate having a plurality of electrodes on a main surface thereof;
   mounting said semiconductor chip on the main surface of said substrate so that said salient electrodes are electrically connected to the electrodes on the substrate;
   providing a cap having a heat transfer portion and a sealing portion and interposing a metallic member between the back of said semiconductor chip and said heat transfer portion; and
   heat-melting said metallic member and allowing a portion of the thus-melted metallic member to flow in between said sealing portion and said substrate to effect sealing.

2. A method of fabricating a semiconductor device according to claim 1, wherein said metallic member is a solder.

3. A method of fabricating a semiconductor device according to claim 1, wherein said sealing step is carried out in an equilibrium state between an atmosphere in which said semiconductor chip is present and an atmosphere outside said cap.

4. A method of fabricating a semiconductor device according to claim 1, wherein said sealing step is carried out while an atmosphere in which said semiconductor chip is present and an atmosphere outside said cap are held at pressures approximately equal to each other.

5. A method of fabricating a semiconductor device, comprising the steps of:
   providing a semiconductor ship having a main surface and a back, with a plurality of salient electrodes being formed on said main surface, and also providing a substrate having a plurality of electrodes on a main surface thereof;
   mounting said semiconductor chip on the main surface of said substrate so that said salient electrodes are electrically connected to the electrodes on the substrate;
   providing a cap having a sealing portion and a heat transfer portion, said cap having a first metallized layer formed on said sealing portion, a second metallized layer formed on said heat transfer portion, and further having a third metallized layer which connects said first and second metallized layers partially with each other;
   interposing a metallic member between the back of said semiconductor chip and said second metallized layer; and
   heat-melting said metallic member and allowing a portion of the thus-melted metallic member to flow in between said sealing portion and said substrate to effect sealing;
   wherein said melted metallic member is allowed to flow from said second metallized layer to said first metallized layer through said third metallized layer.

6. A method of fabricating a semiconductor device according to claim 5, wherein said metallic member is a solder.

7. A method of fabricating a semiconductor device according to claim 5, wherein said sealing step is carried out in an equilibrium state between an atmosphere in which said semiconductor chip is present and an atmosphere outside said cap.

8. A method of fabricating a semiconductor device according to claim 5, wherein said sealing step is carried out while an atmosphere in which said semiconductor device is present and an atmosphere outside said cap are held at pressures approximately equal to each other.

9. A method of fabricating a semiconductor device, comprising the steps of:
   providing a semiconductor chip having a main surface and a back, with a plurality of salient electrodes being formed on said main surface, and providing a substrate having a plurality of electrodes;
   mounting said semiconductor chip on the main surface of said substrate so that said salient electrodes are electrically connected to the electrodes on the substrate;
   providing a cap having a sealing portion and a heat transfer portion positioned on an inner wall of a cavity, said cap having a first metallized layer formed on said sealing portion, a second metallized layer formed on said heat transfer portion, and further having a third metallized layer contiguous to said first metallized layer and formed on an outer wall of said sealing portion opposed to said inner wall;

interposing a metallic member between the back of said semiconductor chip and said second metallized layer; and heat-melting said metallic member and allowing a portion of the thus-melted metallic member to flow in between said sealing portion and said substrate to effect sealing, wherein a portion of said melted metallic member comes into contact with said third metallized layer.

10. A method of fabricating a semiconductor device, comprising the steps of:

providing a semiconductor chip having a main surface and a back, with a plurality of salient electrodes being formed on said main surface, and also providing a substrate having a plurality of electrodes on a main surface thereof;

mounting said semiconductor chip on the main surface of said substrate so that said salient electrodes are electrically connected to the electrodes on the substrate;

providing a cap having a sealing portion and a heat transfer portion positioned on an inner wall of a cavity, said cap having a first metallized layer formed on said sealing portion, a second metallized layer formed on aid heat transfer portion, and further having a third metallized layer contiguous to said first metallized layer and electrically insulated from said second metallized layer by said inner wall;

interposing a metallic member between the back of said semiconductor chip and said second metallized layer; and heat-melting said metallic member and allowing a portion of the thus-melted metallic member to flow in between said sealing portion and said substrate, wherein said melted metallic member is allowed to flow from said second metallized layer to said first metallized layer through said third metallized layer.

11. A method of fabricating a semiconductor device according to claim 10, wherein the distance between said third metallized layer and the main surface of said substrate is larger than the distance between the main surface of said semiconductor chip and the main surface of said substrate.

12. A method of fabricating a semiconductor devices comprising the steps of:

providing a semiconductor chip having a main surface and a back, with a plurality of salient electrodes being formed on said main surface, and also providing a substrate having a plurality of electrodes on a main surface thereof;

mounting said semiconductor chip on the main surface of said substrate so that said salient electrodes are electrically connected to the electrodes on the substrate;

providing a cap having a sealing portion and a heat transfer portion, said cap having a first metallized layer formed on said sealing portion, a second metallized layer formed on said heat transfer portion, and a third metallized layer which connects said first and second K metallized layers partially with each other, with a first metallic member being formed on said first metallized layer;

interposing a second metallic member between the back of said semiconductor chip and said second metallized layer; and heat-melting said second metallic member and allowing a portion of the thus melted metallic member to flow in between said sealing portion and said substrate, wherein said melted metallic member flows from said second metallized layer to said first metallized layer through said third metallized layer.

13. A method of fabricating a semiconductor device according to claim 12, wherein said first and second metallic members are constituted by the same material.

14. A method of fabricating a semiconductor device according to claim 13, wherein the material of said metallic members is a solder.

15. A method of fabricating a semiconductor device according to claim 12, wherein said sealing step is carried out in an equilibrium state between an atmosphere in which said semiconductor chip is present and an atmosphere outside said cap.

16. A method of fabricating a semiconductor device according to claim 12, wherein said sealing step is carried out while an atmosphere in which said semiconductor chip is present and an atmosphere outside said cap are held at pressures approximately equal to each other.

* * * * *